(12) United States Patent
Ghyselen

(10) Patent No.: US 11,398,595 B2
(45) Date of Patent: Jul. 26, 2022

(54) METHOD FOR TREATING A LAYER OBTAINED BY IMPLANTATION THEN DETACHMENT FROM A SUBSTRATE

(71) Applicant: Soitec, Bernin (FR)

(72) Inventor: Bruno Ghyselen, Seyssinet (FR)

(73) Assignee: SOITEC, Bernin (FR)

(*) Notice: Subject to any disclaimer, the term of this patent is extended or adjusted under 35 U.S.C. 154(b) by 679 days.

(21) Appl. No.: 16/304,071

(22) PCT Filed: May 24, 2017

(86) PCT No.: PCT/FR2017/051290
§ 371 (c)(1),
(2) Date: Nov. 21, 2018

(87) PCT Pub. No.: WO2017/203173
PCT Pub. Date: Nov. 30, 2017

(65) Prior Publication Data
US 2020/0328342 A1 Oct. 15, 2020

(30) Foreign Application Priority Data
May 25, 2016 (FR) ...................................... 1654673

(51) Int. Cl.
*H01L 41/337* (2013.01)
*H01L 41/27* (2013.01)
(Continued)

(52) U.S. Cl.
CPC ............ *H01L 41/337* (2013.01); *H01L 41/27* (2013.01); *H01L 41/332* (2013.01); *G01N 29/222* (2013.01)

(58) Field of Classification Search
CPC ....... H01L 41/35; H01L 41/47; H01L 41/337; H01L 41/27; H01L 41/332; G01N 29/222
See application file for complete search history.

(56) References Cited

U.S. PATENT DOCUMENTS 7,274,058 B2 * 9/2007 Lee ..................... H01L 21/0226
257/295
7,548,015 B2 * 6/2009 Benslimane ............ H01L 41/45
310/367
(Continued)

FOREIGN PATENT DOCUMENTS

CN 102569640 B 11/2014
DE 112013006227 T5 10/2015
(Continued)

OTHER PUBLICATIONS

Japanese Notification of Reasons for Rejection for Japanese Application No. 2018-561713 dated Apr. 2, 2021, 4 pages.
(Continued)

*Primary Examiner* — Jeffrey T Carley
(74) *Attorney, Agent, or Firm* — TraskBritt

(57) ABSTRACT

A method for treating a layer of composition $ABO_3$, wherein A is a first material composition consisting of at least one element selected from the group consisting of: Li, Na, K, H, Ca, Mg, Ba, Sr, Pb, La, Bi, Y, Dy, Gd, Tb, Ce, Pr, Nd, Sm, Eu, Ho, Zr, Sc, Ag, and Tl, and wherein B is a second material composition consisting of at least one element selected from the group consisting of: Nb, Ta, Sb, Ti, Zr, Sn, Ru, Fe, V, Sc, C, Ga, Al, Si, Mn, Zr, and Tl, is described. The method includes implanting an ionic species into a donor substrate of the composition $ABO_3$, thereby forming a weakened zone delineating the layer, detaching the layer from the donor substrate along the weakened zone, and exposing the detached layer to a medium containing ions of a constituent element A, such that the ions penetrate into the layer.

22 Claims, 3 Drawing Sheets

(51) Int. Cl.
*H01L 41/332* (2013.01)
*G01N 29/22* (2006.01)

(56) References Cited

U.S. PATENT DOCUMENTS

| | | | | |
|---|---|---|---|---|
| 7,566,629 | B2* | 7/2009 | Booth, Jr. | H01L 21/76243 257/E21.563 |
| 8,497,190 | B2* | 7/2013 | Landru | H01L 21/76243 438/479 |
| 9,385,301 | B2 | 7/2016 | Kando et al. | |
| 9,553,253 | B2* | 1/2017 | Iwamoto | H01L 41/22 |
| 9,876,160 | B2* | 1/2018 | Biggs | B32B 38/0012 |
| 2003/0127042 | A1 | 7/2003 | Tsou et al. | |
| 2011/0030889 | A1 | 2/2011 | Tauzin et al. | |
| 2011/0123163 | A1 | 5/2011 | Muller et al. | |
| 2014/0327013 | A1* | 11/2014 | Schenk | B82Y 20/00 257/76 |
| 2017/0119349 | A1* | 5/2017 | Miyazawa | H01L 41/29 |

FOREIGN PATENT DOCUMENTS

| | | | |
|---|---|---|---|
| EP | 2506431 A1 | 10/2012 | |
| EP | 2182562 B1 | 8/2013 | |
| JP | 2011-523395 A | 8/2011 | |
| WO | 2011/065317 A1 | 6/2011 | |
| WO | WO-2016118536 A2 * | 7/2016 | H01L 51/052 |

OTHER PUBLICATIONS

Steichen et al., Acoustic Components Used for Filtering—Models and Simulation Tools, https://www.techniques-ingenieur.fr/base-documentaire/electronique-photonique-th13/materiaux-pour-l-electronique-et-dispositifs-associes-42271210/composants-acoustiques-utilises-pour-le-filtrage-e2001/, Nov. 10, 2010, 3 pages.

Korkishko et al., Reverse proton exchange for buried waveguides in LiNbO3, J. Opt. Soc. Am. A, vol. 15, No. 7, Jul. 1998, 6 pages.

International Written Opinion for International Application No. PCT/FR2017/051290 dated Sep. 27, 2017, 4 pages.

International Search Report for International Application No. PCT/FR2017/051290 dated Sep. 27, 2017, 4 pages.

Brugere et al., Piezoresponse Force Microscopy Study of a Single-Crystal LiTaO3 Thin Film Obtained by the Smart Cut Technology, Applications of Ferroelectrics (ISAF), 2010 IEEE INternational Symposium on the IEEE, (Aug. 9, 2010), 4 pages.

Japanese Notification of Reason for Rejections for Japanese Application No. 2018-561713 dated Sep. 10, 2021, 4 pages with translation.

Chinese First Notification of Office Action for Chinese Application No. 201780032137.7 dated Sep. 3, 2021, 12 pages.

Chinese 2nd Notification of Office Action for Application No. 201780032137.7 dated Jan. 19, 2022, 8 pages.

* cited by examiner

METHOD FOR TREATING A LAYER OBTAINED BY IMPLANTATION THEN DETACHMENT FROM A SUBSTRATE

CROSS-REFERENCE TO RELATED APPLICATIONS

This application is a national phase entry under 35 U.S.C. § 371 of International Patent Application PCT/FR2017/051290, filed May 24, 2017, designating the United States of America and published as International Patent Publication WO 2017/203173 A1 on Nov. 30, 2017, which claims the benefit under Article 8 of the Patent Cooperation Treaty to French Patent Application Serial No. 1654673, filed May 25, 2016.

TECHNICAL FIELD

This disclosure relates to a method for healing defects in a layer of composition $ABO_3$, where A consists of at least one element selected from: Li, Na, K, H, Ca, Mg, Ba, Sr, Pb, La, Bi, Y, Dy, Gd, Tb, Ce, Pr, Nd, Sm, Eu, Ho, Zr, Sc, Ag, Tl and B consists of at least one element selected from: Nb, Ta, Sb, Ti, Zr, Sn, Ru, Fe, V, Sc, C, Ga, Al, Si, Mn, Zr, Tl, obtained by a method involving an implantation followed by a detachment from a substrate, and a method for producing such a layer, notably for an application to a microelectronic, photonic or optic device. The disclosure also relates to methods for producing a bulk acoustic wave device and a surface acoustic wave device comprising such a layer.

BACKGROUND

Among acoustic components used for filtering in the radiofrequency domain, two main categories of filters may be distinguished:
- on the one hand, surface acoustic wave (SAW) filters;
- on the other hand, bulk acoustic wave (BAW) filters and resonators.

For a review of these technologies, reference may be made to the article of W. Steichen and S. Ballandras, "Composants acoustiques utilisés pour le filtrage—Revue des différentes technologies," Techniques de l'Ingénieur, E2000, 2008.

Surface acoustic wave filters typically comprise a thick piezoelectric layer (that is to say, of thickness generally of several hundreds of μm) and two electrodes in the form of two interdigitated metal combs deposited on the surface of the piezoelectric layer. An electrical signal, typically a variation in electrical voltage, applied to an electrode is converted into an elastic wave that propagates on the surface of the piezoelectric layer. The propagation of this elastic wave is favored if the frequency of the wave corresponds to the frequency range of the filter. This wave is again converted into an electrical signal on reaching the other electrode.

Bulk acoustic wave filters for their part typically comprise a thin piezoelectric layer (that is to say, of thickness generally much less than 1 μm) and two electrodes arranged on each main face of the thin layer. An electrical signal, typically a variation in electrical voltage, applied to an electrode is converted into an elastic wave that propagates through the piezoelectric layer. The propagation of this elastic wave is favored if the frequency of the wave corresponds to the frequency range of the filter. This wave is again converted into an electrical voltage on reaching the electrode situated on the opposite face.

In the case of surface acoustic wave filters, the piezoelectric layer has to have an excellent crystalline quality so as not to cause attenuation of the surface wave. It will thus be preferred to use a monocrystalline layer here. At the present time, suitable materials that can be used industrially are quartz, $LiNbO_3$ or $LiTaO_3$. The piezoelectric layer is obtained by cutting from an ingot of one of the materials, the precision required for the thickness of the layer not being very important in so far as the waves have to propagate essentially on its surface.

In the case of bulk acoustic wave filters, the piezoelectric layer must have a determined thickness that is uniform over the whole of the layer, and must be so in a precisely controlled manner. On the other hand, crystalline quality, hence, passing to the second order of parameters of importance for the performances of the filter, compromises are presently made with regard to the crystalline quality and a polycrystalline layer has for a long time been considered as acceptable. The piezoelectric layer is thus formed by deposition on a support substrate (for example, a silicon substrate). At the present time, the materials employed industrially for such a deposition are AlN, ZnO and PZT.

The choices of materials are thus very limited in both technologies.

Yet, the choice of a material results from a compromise between different properties of the filter, as a function of the specifications of the manufacturer of the filter.

In order to offer more freedom in the dimensioning of bulk acoustic wave filters or surface acoustic wave filters, it would be desirable to be able to use more materials than the materials listed above. In particular, materials traditionally used for surface acoustic wave filters could represent interesting alternatives for bulk acoustic wave filters.

This imposes however being able to obtain thin, uniform layers of good quality of these materials.

A first possibility would be to thin the thick layers cut from ingots, by polishing and/or etching techniques. However, these techniques lead to a considerable loss of material and do not make it possible to obtain a layer of several hundreds of nanometers thickness with the required uniformity.

A second possibility would be to implement a SMART CUT® type layer transfer by creating a weakened zone in a donor substrate of $LiNbO_3$ or $LiTaO_3$ so as to delineate the thin layer to transfer, by bonding the layer to transfer on a support substrate and by detaching the donor substrate along the weakened zone so as to transfer the thin layer onto the support substrate. However, the creation of the weakened zone by ion implantation in the donor substrate damages the transferred layer and deteriorates its piezoelectric properties. Healing methods (notably annealings) known for the transfer of silicon layers do not always make it possible to repair completely the piezoelectric layer, on account of the complex crystalline structure of the layer and damage mechanisms that seem different to those that intervene in silicon.

BRIEF SUMMARY

One aim of the present disclosure is thus to conceive a method making it possible to more efficiently heal defects linked to the implementation of the SMART CUT® method in an $ABO_3$ type substrate.

In accordance with the disclosure, a method is described for healing defects in a layer of composition $ABO_3$ where A consists of at least one element selected from: Li, Na, K, H, Ca, Mg, Ba, Sr, Pb, La, Bi, Y, Dy, Gd, Tb, Ce, Pr, Nd, Sm, Eu, Ho, Zr, Sc, Ag, Tl and B consists of at least one element selected from: Nb, Ta, Sb, Ti, Zr, Sn, Ru, Fe, V, Sc, C, Ga, Al, Si, Mn, Zr, Tl, the layer being obtained by a layer transfer method in which ionic species are implanted into a substrate of composition $ABO_3$ so as to form a weakened zone delineating the layer, then the substrate is detached along the weakened zone to obtain a layer that is detached from the rest of the donor substrate, wherein the method comprises exposing the layer to a medium containing ions of a the constituent element A so as to make the ions penetrate into the transferred layer.

"Substrate of composition $ABO_3$" is taken to mean a substrate entirely consisting of $ABO_3$ or comprising at least one layer of this material and in which may be formed, by implantation then detachment, the layer of composition $ABO_3$ subject to the method for healing defects.

In the case where A consists of two or more elements, "constituent element A" designates one of these elements. By extension and for the sake of concision, the element that the healing method makes it possible to penetrate into the layer to heal is designated by "element A" in the remainder of the text.

In a particularly advantageous manner, the ions of the element A penetrate into the layer by an ion exchange mechanism.

According to one embodiment, the medium containing the ions of the element A is a liquid and the layer is immersed in a bath of the liquid.

For example, the layer of composition $ABO_3$ may be immersed in a bath comprising an acid solution of a salt comprising the element A.

According to another embodiment, the medium containing the ions of the element A is in gaseous phase and the layer of composition $ABO_3$ is exposed to the gas.

According to another embodiment, the medium containing the ions of the element A is in solid phase, a layer of the medium being deposited on the layer of composition $ABO_3$.

Advantageously, the method comprises at least one annealing step to favor the diffusion of the element A from the medium to the layer of composition $ABO_3$.

According to a particular embodiment, the element A is lithium.

The layer may be immersed in a bath comprising an acid solution of a lithium salt.

Lithium ions advantageously penetrate into the layer by a reverse proton exchange mechanism.

According to one embodiment of the disclosure, the layer of composition $ABO_3$ is monocrystalline.

Another object relates to a method for producing a layer of composition $ABO_3$ where A consists of at least one element selected from: Li, Na, K, H, Ca, Mg, Ba, Sr, Pb, La, Bi, Y, Dy, Gd, Tb, Ce, Pr, Nd, Sm, Eu, Ho, Zr, Sc, Ag, Tl and B consists of at least one element selected from: Nb, Ta, Sb, Ti, Zr, Sn, Ru, Fe, V, Sc, C, Ga, Al, Si, Mn, Zr, Tl, wherein, the method comprises:
  providing a donor substrate of composition $ABO_3$,
  the formation of a weakened zone by implantation of ionic species in the donor substrate so as to delineate the layer,
  the detachment from the donor substrate along the weakened zone so as to obtain the layer detached from the rest of the donor substrate, the layer comprising defects,
  implementing the method for healing defects of the layer as described above.
Preferably, the implanted species comprises hydrogen and/or helium.

According to one embodiment, before the healing step, a part of the thickness of the layer of composition $ABO_3$ is removed.

According to one embodiment, the thickness of the layer is greater than 2 μm, preferably greater than 20 μm, the layer being self-supporting at the end of the detachment from the donor substrate.

According to another embodiment, the method comprises, between the step of formation of the weakened zone and the step of detachment from the donor substrate along the weakened zone, the application of a receiver substrate on the donor substrate, the layer of composition $ABO_3$ being at the interface between the substrates, the layer being transferred onto the receiver substrate at the end of the detachment from the donor substrate.

The application of the receiver substrate may comprise the deposition of the substrate on the donor substrate.

Alternatively, the application of the receiver substrate comprises the bonding of the substrate on the donor substrate.

Advantageously, the thickness of the layer of composition $ABO_3$ is less than 20 μm.

Optionally, at least one electrically insulating layer and/or at least one electrically conducting layer is formed at the interface between the receiver substrate and the layer to transfer.

The disclosure also relates to a method for producing a bulk acoustic wave device, comprising forming electrodes on two opposite main faces of a piezoelectric layer, wherein the method comprises the production of the piezoelectric layer by a method as described above.

The disclosure also relates to a method for producing a surface acoustic wave device, comprising the formation of two interdigitated electrodes on the surface of a piezoelectric layer, wherein the method comprises the production of the piezoelectric layer by a method as described above.

BRIEF DESCRIPTION OF THE DRAWINGS

Other characteristics and advantages of the disclosure will become clear from the detailed description that follows, with reference to the accompanying drawings, in which.

For reasons of legibility of the figures, the elements illustrated are not necessarily represented to scale. Furthermore, elements designated by the same reference signs in different figures are identical.

DETAILED DESCRIPTION

Figure 1A:
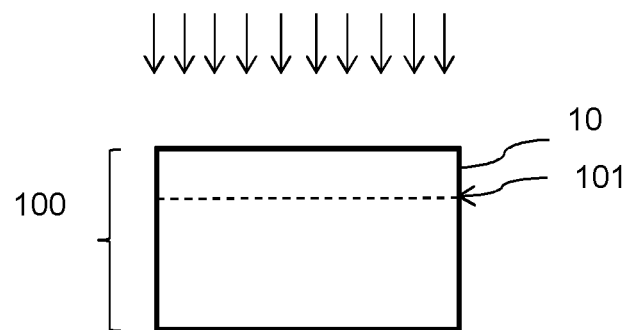
FIGS. 1A to 1E schematically illustrate the steps of the method for producing a monocrystalline layer of composition $ABO_3$ according to one embodiment of the disclosure.
Figure 1B:
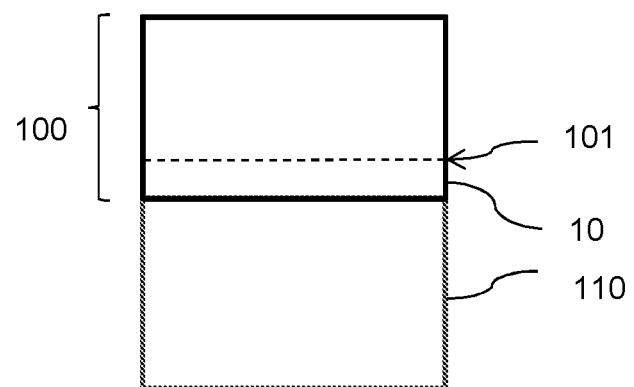
Figure 1C:
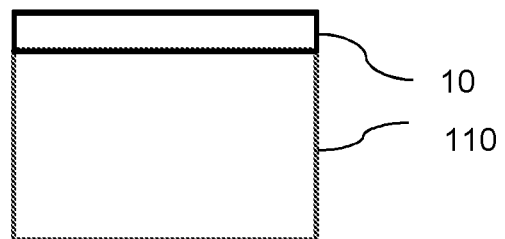

With reference to FIGS. 1A to 1D, a method is considered for producing a layer of composition $ABO_3$ implementing the SMART CUT® method, comprising the following steps:
  providing a donor substrate of composition $ABO_3$,
  forming a weakened zone 101 by implantation of ionic species (for example, hydrogen and/or helium) into the donor substrate 100 so as to delineate the layer 10 to transfer (cf. FIG. 1A),
  applying a receiver substrate 110 on the donor substrate 100, the layer 10 to transfer being at the interface (cf. FIG. 1B), detaching the donor substrate 100 along the weakened zone 101 so as to transfer the layer 10 onto the receiver substrate 110 (cf. FIG. 1C).

The donor substrate may be a bulk substrate of the considered material. Alternatively, the donor substrate may be a composite substrate, that is to say, formed of a stack of at least two layers of different materials, of which a superficial layer consists of the considered monocrystalline material.

Among piezoelectric materials of particular interest are perovskites and comparable materials, of $ABO_3$ structure. However, the interest that can be placed in these materials is not limited to their piezoelectric character. Notably for other applications, for example, linked to integrated optics, interest could also be taken in them if need be for their dielectric permittivity, for their refractive indices, or instead for their pyroelectric, ferroelectric or instead ferromagnetic properties, for example, and depending on the case.

Several large families stand out. One of them derives notably from binary materials such as $LiNbO_3$, $LiTaO_3$, $KNbO_3$, $KTaO_3$ to end up with a generic formula of $ABO_3$ type where A consists of one or more of the following elements: Li, Na, K, H and where B consists of one or more of the following elements: Nb, Ta, Sb, V. Another large family derives from $SrTiO_3$, $CaTiO_3$, $SrTiO_3$, $PbTiO_3$, $PbZrO_3$ materials notably to end up with a generic formula of $ABO_3$ type where A consists of one or more of the following elements: Ba, Ca, Sr, Mg, Pb, La, Y and where B consists of one or more of the following elements: Ti, Zr, Sn. Other less widespread families may also be derived from $BiFeO_3$, or instead $LaMnO_3$, $BaMnO_3$, $SrMnO_3$, or instead $LaAlO_3$, or instead, $LiAlO_3$, $LiGaO_3$, or instead $CaSiO_3$, $FeSiO_3$, $MgSiO_3$, or instead $DyScO_3$, $GdScO_3$ and $TbScO_3$.

In the end, it could be summarized by considering that A consists of one or more of the following elements selected from: Li, Na, K, H, Ca, Mg, Ba, Sr, Pb, La, Bi, Y, Dy, Gd, Tb, Ce, Pr, Nd, Sm, Eu, Ho, Zr, Sc, Ag, Tl and B consists of one or more of the following elements selected from: Nb, Ta, Sb, Ti, Zr, Sn, Ru, Fe, V, Sc, C, Ga, Al, Si, Mn, Zr, Tl.

Some of these materials are monocrystalline; others are not monocrystalline.

The crystalline nature and the composition of the donor substrate are selected by those skilled in the art depending on the use planned for the layer to transfer.

The receiver substrate has a function of mechanical support of the transferred layer. It may be of any nature and, advantageously but not imperatively, adapted to the targeted application, the transferred layer optionally being able to be transferred later onto another substrate. The receiver substrate may be bulk or composite.

According to one embodiment, the application of the receiver substrate on the donor substrate is carried out by bonding.

Alternatively, the application of the receiver substrate on the donor substrate is carried out by a deposition of the receiver substrate on the donor substrate. Any suitable deposition technique, such as, for example, but in a non-limiting manner, an evaporation, a cathodic sputtering, an aerosol sputtering, a chemical phase deposition, an electrodeposition, a spread coating, a spin coating, a varnishing, a screen printing, an immersion, may be used. Such a solution is particularly advantageous to compensate for poor adhesion of the donor substrate vis-à-vis the receiver substrate.

Optionally, the method comprises forming at least one electrically insulating layer and/or at least one electrically conducting layer (not represented) at the interface between the receiver substrate 110 and the layer 10 to transfer.

In the case where the layer 10 is sufficiently thick to confer thereon a certain mechanical strength, notably during the operation of detachment along the weakened zone, the step of application of the receiver substrate may be omitted. The layer 10 is then called self-supporting after its detachment from the rest of the donor substrate. In this case, the thickness of the layer 10 is typically greater than 2 μm, preferably greater than 20 μm, and the implantation energy of the ionic species is greater than 1 MeV.

A transferred layer of composition $LiXO_3$ is taken as an example in the remainder of the text, where X is niobium and/or tantalum. In other words, in this non-limiting example, the element A is lithium and the element B is niobium and/or tantalum, it being understood that those skilled in the art are able to define suitable conditions for the other materials cited above. Notably, the healing of the layer 10 involves an ion exchange mechanism that is used in the glass field. For example, it is known to replace a part of the Na+ ions present in certain glasses by Ag+ or K+ ions, by implementing a treatment consisting in immersing the glass in a bath of molten salts, for example, $AgNO_3$ or $KNO_3$, respectively. Similarly, the method disclosed herein may be implemented by exposing the layer to heal to a medium containing ions of the element A with which it is wished to enrich the layer, the medium being able to be liquid (for example, a bath of an acid solution of a salt comprising the element A), gaseous or solid.

During the method for transferring the layer 10 from the donor substrate to the receiver substrate, notably during the implantation of the ionic species and/or thermal treatments of reinforcement of the bonding or detachment, lithium may be made to migrate outside of the layer 10.

This migration of lithium may optionally be accompanied by a replacement of the atoms concerned by hydrogen atoms implanted to form the weakened zone.

The transferred layer 10 is thus defective on account of this lithium deficiency.

Figure 1D:
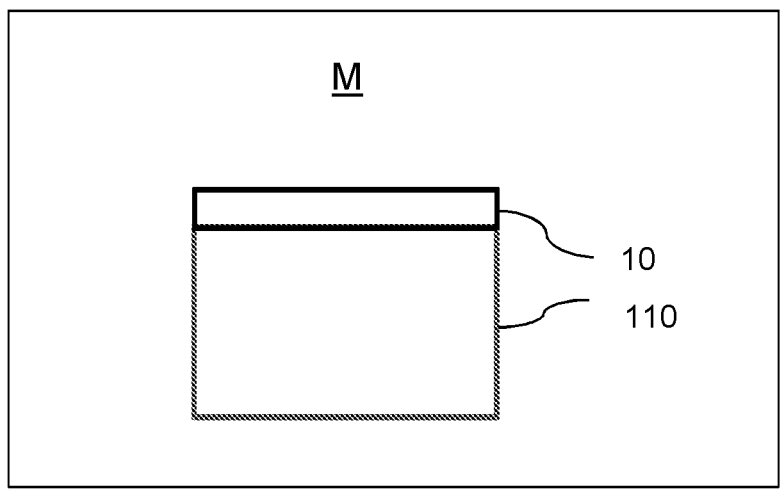

To remedy this, the present disclosure describes a method for healing defects of the transferred layer, in which the transferred layer (and optionally the whole of the receiver substrate that supports it) is exposed to a medium M containing lithium ions (cf. FIG. 1D).

This exposure has the effect of making lithium ions migrate from the medium M to the transferred layer 10, thereby enriching the transferred layer with lithium and restoring the structure of the layer prior to the implantation and to the transfer.

Optionally, hydrogen atoms situated at the location of lithium atoms can migrate to the medium M.

A reverse proton exchange type mechanism is brought into play in this migration.

Reverse proton exchange is described, in relation with a completely other application than that addressed by the present disclosure, in the article of Yu. N. Korkishko et al. entitled "Reverse proton exchange for buried waveguides in $LiNbO_3$," J. Opt. Soc. Am. A, Vol. 15, No. 7, July 1998.

The medium M may be a liquid, in which case, the transferred layer is immersed in a bath of the liquid. For example, in the present example, the medium M is an acid solution of a lithium salt. Those skilled in the art also know how to use mixtures of solutions of $LiNO_3$, $KNO_3$ and $NaNO_3$ to better control the efficiency of this operation.

Alternatively, the medium M may be gaseous, in which case, the transferred layer is placed in an enclosure containing the gas.

Those skilled in the art are able to define the operating conditions of this exposure, notably the composition of the medium, the duration and the temperature of exposure, as a function of the composition of the transferred layer to heal.

Advantageously, the thickness of the transferred layer is less than 20 µm, preferably less than 2 µm.

Figure 1E:
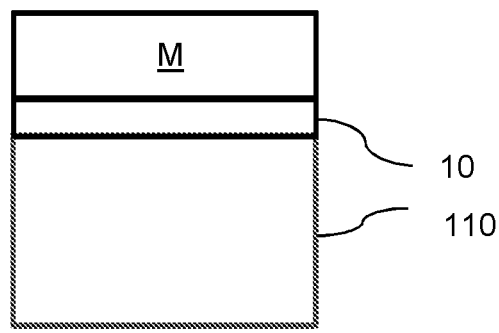

According to another alternative, the medium M may be in solid phase, and the transferred layer 10 is exposed to the medium by deposition of a layer of the medium on the layer 10 (cf. FIG. 1E). "On" is here taken to mean either directly in contact with the layer 10, or through one or more layers formed of different materials, in so far as the intermediate layers do not block the migration of the element A from the layer constituting the medium M to the layer 10.

A better penetration of the ions of the element A into the layer 10 is made possible by one or more annealing steps. The deposited layer containing the element A may be removed at the end of the operation, optionally between two successive annealing steps.

Optionally, before the healing step, a part of the thickness of the layer transferred onto the receiver substrate is removed. This removal may be carried out by chemical mechanical polishing, by etching or by any other appropriate technique.

Two non-limiting applications of the layer 10 transferred and healed according to the method disclosed herein are described hereafter.

Figure 2:
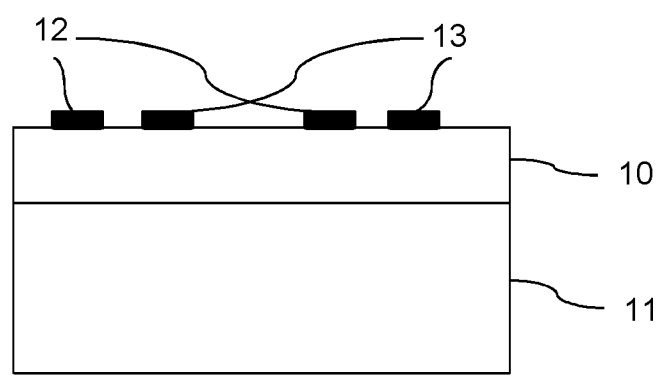
FIG. 2 is a cross-sectional principle view of a surface acoustic wave filter.

FIG. 2 is a principle view of a surface acoustic wave filter.

The filter comprises a piezoelectric layer 10 and two electrodes 12, 13 in the form of two interdigitated metal combs deposited on the surface of the piezoelectric layer. On the side opposite to the electrodes 12, 13, the piezoelectric layer rests on a support substrate 11. The piezoelectric layer 10 is monocrystalline, an excellent crystalline quality indeed being necessary so as not to cause attenuation of the surface wave.

Figure 3:
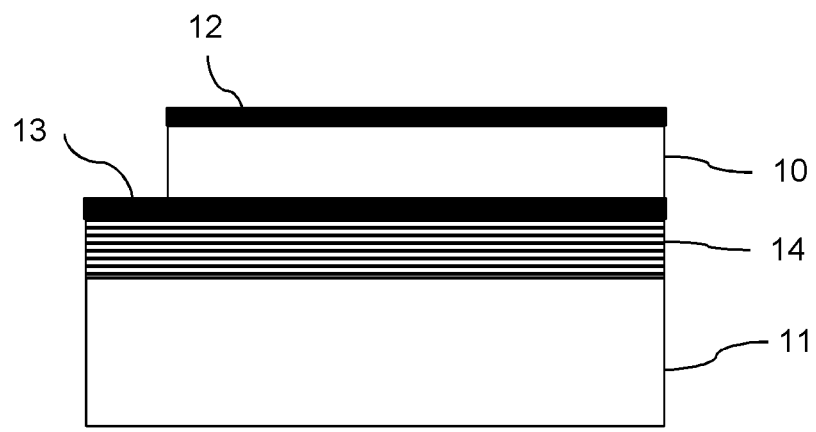
FIG. 3 is a cross-sectional principle view of a bulk acoustic wave filter.

FIG. 3 is a principle view of a bulk acoustic wave resonator.

The resonator comprises a thin piezoelectric layer (that is to say, of thickness generally less than 1 µm, preferably less than 0.2 µm) and two electrodes 12, 13 arranged on either side of the piezoelectric layer 10. The piezoelectric layer 10 rests on a support substrate 11. To insulate the resonator from the substrate and thereby avoid the propagation of waves in the substrate, a Bragg mirror 14 is interposed between the electrode 13 and the substrate 11. Alternatively (not illustrated), this insulation could be achieved by arranging a cavity between the substrate and the piezoelectric layer. These different arrangements are known to those skilled in the art and thus will not be described in detail in the present text.

In certain cases, the receiver substrate may not be optimal for the final application. It may then be advantageous to transfer the layer 10 onto a final substrate (not represented) of which the properties are selected as a function of the targeted application, by bonding it on the final substrate and by removing the receiver substrate by any suitable technique.

In the case where it is wished to produce a surface acoustic wave device, metal electrodes 12, 13 in the form of two interdigitated combs are deposited on the surface of the layer 10 opposite to the receiver substrate 110 or, if need be, opposite to the final substrate (whether it is the receiver substrate 110 or the final substrate, the substrate forms the support substrate noted 11 in FIG. 2).

In the case where it is wished to produce a bulk acoustic wave device, an adaptation of the method described above has to be made. On the one hand, before the step of bonding illustrated in FIG. 1B, a first electrode is deposited on the free surface of the layer 10 to transfer of the donor substrate, this first electrode (referenced 13 in FIG. 3) being buried in the final stack. After the transfer step illustrated in FIG. 1C, a second electrode (referenced 12 in FIG. 3) is deposited on the free surface of the layer 10, opposite to the first electrode. Another option is to transfer the layer 10 onto a final substrate as mentioned above and to form the electrodes before and after the transfer. On the other hand, to avoid the propagation of acoustic waves in the receiver substrate 110, it is possible to integrate therein an insulation means, for example, a Bragg mirror (as illustrated in FIG. 3) or a cavity etched beforehand in the receiver substrate or in the final substrate if need be.

Finally, it goes without saying that the examples that have been given are only particular illustrations that are in no way limiting with regard to the application fields of the disclosure.

The invention claimed is:

1. A method for treating a layer of composition $ABO_3$, wherein A is a first material composition consisting of at least one element selected from the group consisting of: Li, Na, K, H, Ca, Mg, Ba, Sr, Pb, La, Bi, Y, Dy, Gd, Tb, Ce, Pr, Nd, Sm, Eu, Ho, Zr, Sc, Ag, and Tl, and wherein B is a second material composition consisting of at least one element selected from the group consisting of: Nb, Ta, Sb, Ti, Zr, Sn, Ru, Fe, V, Sc, C, Ga, Al, Si, Mn, Zr, and Tl, the method comprising:

implanting an ionic species into a donor substrate of the composition $ABO_3$, thereby forming a weakened zone delineating the layer;

detaching the layer from the donor substrate along the weakened zone; and exposing the detached layer to a medium containing ions of a constituent element A, wherein the constituent element A is one of the at least one element in A, such that the ions penetrate into the detached layer.

2. The method of claim 1, wherein the ions penetrate into the detached layer by an ion exchange mechanism.

3. The method of claim 1, wherein the medium containing the ions is a liquid and the exposing comprises immersing the detached layer in a bath of the liquid.

4. The method of claim 1, wherein the exposing comprises immersing the detached layer in a bath comprising an acid solution of a salt comprising the constituent element A.

5. The method of claim 1, wherein the medium containing the ions is in gaseous phase and the exposing comprises exposing the detached layer to the gas.

6. The method of claim 1, wherein the medium containing the ions is in solid phase and the exposing comprises depositing the medium on the detached layer.

7. The method of claim 6, further comprising annealing to cause diffusion of the constituent element A from the medium to the detached layer.

8. The method of claim 1, wherein A is lithium.

9. The method of claim 8, wherein the ions penetrate into the detached layer by a reverse proton exchange mechanism.

10. The method of claim 8, wherein the exposing comprises immersing the detached layer in a bath comprising an acid solution of a lithium salt.

11. The method of claim 1, wherein the detached layer is monocrystalline.

12. A method for treating a layer of composition $ABO_3$ wherein A is a first material composition consisting of at least one element selected from the top group consisting of: Li, Na, K, H, Ca, Mg, Ba, Sr, Pb, La, Bi, Y, Dy, Gd, Tb, Ce, Pr, Nd, Sm, Eu, Ho, Zr, Sc, Ag, and Tl, and wherein B is a second material composition consisting of an element selected from: Nb, Ta, Sb, Ti, Zr, Sn, Ru, Fe, V, Sc, C, Ga, Al, Si, Mn, Zr, and Tl, the method comprising:

providing a donor substrate of the composition $ABO_3$;

forming a weakened zone by implanting an ionic species in the donor substrate to delineate the layer;

detaching the layer from the donor substrate along the weakened zone, the detached layer comprising defects; and exposing the detached layer to a medium containing ions of a constituent element A, wherein the constituent element A is one of the at least one elements in A, such that the ions penetrate into the detached layer, healing the defects.

13. The method of claim 12, wherein the implanted ionic species comprises one or both of hydrogen and helium.

14. The method of claim 12, further comprising removing a part of the thickness of the detached layer before exposing the detached layer to the medium.

15. The method of claim 12, wherein the thickness of the layer is greater than 2 µm, the detached layer being self-supporting at the end of the detachment from the donor substrate.

16. The method of claim 12, further comprising;

applying a receiver substrate on the donor substrate between the step of forming the weakened zone and the stop of detaching the layer from the donor substrate along the weakened zone, the layer being at the interface between the receiver substrate and the donor substrate; and transferring the detached layer onto the receiver substrate at the end of the step of detaching the layer from the donor substrate along the weakened zone.

17. The method of claim 16, wherein applying the receiver substrate comprises depositing the receiver substrate on the donor substrate.

18. The method of claim 16, wherein applying the receiver substrate comprises bonding the receiver substrate to the donor substrate.

19. The method of claim 16, wherein the thickness of the detached layer is less than 20 µm.

20. The method of claim 16, further comprising: forming at least one additional layer at the interface between the receiver substrate and the detached layer, wherein the at least one additional layer comprises at least one of the electrically insulating layer and an electrically conducting layer.

21. The method of claim 12, further comprising: producing a bulk acoustic wave device, the producing comprising forming electrodes on two opposite main faces of the detached layer, which comprises a piezoelectric layer.

22. The method of claim 12, further comprising: producing a surface acoustic wave device, the producing comprising forming interdigitated electrodes on a surface of the detached layer, which comprises a piezoelectric layer.

* * * * *

UNITED STATES PATENT AND TRADEMARK OFFICE
CERTIFICATE OF CORRECTION

PATENT NO. : 11,398,595 B2
APPLICATION NO. : 16/304071
DATED : July 26, 2022
INVENTOR(S) : Bruno Ghyselen It is certified that error appears in the above-identified patent and that said Letters Patent is hereby corrected as shown below:

In the Claims

| | | | |
|---|---|---|---|
| Claim 1, | Column 8, | Line 37, | change "element" to --elements-- |
| Claim 12, | Column 8, | Line 66, | change "the top group" to --the group-- |
| Claim 15, | Column 9, | Line 22, | change "layer is" to --detached layer is-- |
| Claim 16, | Column 9, | Line 28, | change "stop of" to --step of-- |
| Claim 20, | Column 10, | Line 18, | change "one of the" to --one of an-- |

Signed and Sealed this
Fourteenth Day of March, 2023

Katherine Kelly Vidal
*Director of the United States Patent and Trademark Office*